US011600590B2

(12) United States Patent
Liu et al.

(10) Patent No.: US 11,600,590 B2
(45) Date of Patent: Mar. 7, 2023

(54) SEMICONDUCTOR DEVICE AND SEMICONDUCTOR PACKAGE

(71) Applicant: Advanced Semiconductor Engineering, Inc., Kaohsiung (TW)

(72) Inventors: Wei-Wei Liu, Kaohsiung (TW); Huei-Siang Wong, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/362,347

(22) Filed: Mar. 22, 2019

(65) Prior Publication Data

US 2020/0303334 A1 Sep. 24, 2020

(51) Int. Cl.
*H01L 23/00* (2006.01)
*H01L 23/488* (2006.01)
*H01L 21/603* (2006.01)

(52) U.S. Cl.
CPC .............. *H01L 24/17* (2013.01); *H01L 24/02* (2013.01); *H01L 24/09* (2013.01); *H01L 24/04* (2013.01); *H01L 24/14* (2013.01); *H01L 2224/0401* (2013.01); *H01L 2224/1403* (2013.01); *H01L 2224/16055* (2013.01)

(58) Field of Classification Search
CPC ......... H01L 24/01; H01L 24/02; H01L 24/04; H01L 24/06; H01L 24/10; H01L 24/12; H01L 24/14; H01L 24/18; H01L 24/20; H01L 24/26; H01L 24/28; H01L 24/30; H01L 24/34; H01L 24/36; H01L 24/38; H01L 24/63; H01L 24/65; H01L 24/70; H01L 24/80–89; H01L 24/96; H01L 24/97; H01L 2224/02; H01L 2224/0212; H01L 2224/02123; H01L 2224/02125; H01L 2224/0213; H01L 2224/0214; H01L 2224/02141; H01L 2224/02145; H01L 2224/0215; H01L 2224/02163; H01L 2224/02165; H01L 2224/0217; H01L 2224/0218–0219; H01L 2224/03005; H01L 2224/03011; H01L 2224/03015; H01L 2924/014; H01L 2224/13147; H01L 2924/01029; H01L 23/49811; H01L 23/49827; H01L 24/16; H01L 24/17; H01L 24/81; H01L 24/94; H01L 2924/15311; H01L 2924/381; H01L 2924/3841
See application file for complete search history.

(56) References Cited

U.S. PATENT DOCUMENTS 5,869,881 A * 2/1999 Lee .................. H01L 29/66272
257/586
5,943,597 A * 8/1999 Kleffner ................. H01L 24/05
438/613

(Continued)

*Primary Examiner* — Maliheh Malek
(74) *Attorney, Agent, or Firm* — Foley & Lardner LLP

(57) ABSTRACT

A semiconductor device and a semiconductor package including the same are provided. The semiconductor device includes a semiconductor element; a protective layer disposed adjacent to the surface of the semiconductor element, the protective layer defining an opening to expose the semiconductor element; a first bump disposed on the semiconductor element; and a second bump disposed onto the surface of the protective layer. The first bump has a larger cross-section surface area than the second bump.

17 Claims, 11 Drawing Sheets

(56) References Cited

U.S. PATENT DOCUMENTS 6,096,595 A * 8/2000 Huang .............. H01L 21/28518 257/E21.165
6,114,231 A * 9/2000 Chen ....................... H01L 24/02 438/612
6,218,302 B1 * 4/2001 Braeckelmann ............................ H01L 21/76807 438/687
7,019,407 B2 * 3/2006 Chen ....................... H01L 24/81 257/778
7,170,162 B2 * 1/2007 Chang ................. H01L 21/6835 257/700
7,462,942 B2 12/2008 Tan et al.
7,977,783 B1 * 7/2011 Park ........................ H01L 24/11 257/692
8,022,544 B2 * 9/2011 Lin ......................... H01L 24/05 257/758
8,129,267 B2 * 3/2012 Cabral, Jr. .............. H01L 24/14 438/625
8,304,867 B2 * 11/2012 McCarthy ............... H01L 24/14 257/669
8,405,213 B2 * 3/2013 Chen ....................... H01L 21/50 257/738
8,421,211 B2 4/2013 Kang et al.
8,569,162 B2 * 10/2013 Chien ..................... H01L 24/13 438/613
8,710,657 B2 * 4/2014 Park ........................ H01L 24/13 257/738
8,778,738 B1 * 7/2014 Lin ....................... H01L 21/561 438/118
8,829,676 B2 * 9/2014 Yu ........................... H01L 24/19 257/738
8,877,554 B2 * 11/2014 Tsai .................... H01L 23/5389 438/106
8,970,035 B2 * 3/2015 Lin ......................... H01L 24/81 257/737
9,059,107 B2 * 6/2015 Pan ......................... H01L 24/19
9,219,016 B2 * 12/2015 Lin ......................... H01L 24/13
9,281,234 B2 * 3/2016 Chen ................. H01L 21/76802
9,318,429 B2 * 4/2016 Hu ........................ H01L 21/568
9,337,141 B2 * 5/2016 Lin ..................... H01L 23/5227
9,391,028 B1 * 7/2016 Chen ..................... H01L 23/544
9,391,046 B2 * 7/2016 Park .................... H01L 25/0652
9,449,947 B2 * 9/2016 Yu ..................... H01L 23/49816
9,460,987 B2 * 10/2016 Hung ................ H01L 21/76843
9,484,227 B1 * 11/2016 Cheng ................... H01L 25/105
9,508,671 B2 * 11/2016 Chiu ..................... H01L 23/293
9,570,366 B2 * 2/2017 Jeng ........................ H01L 24/11
9,570,410 B1 * 2/2017 Chang ................. H01L 23/5389
9,589,903 B2 * 3/2017 Chen ....................... H01L 24/19
9,595,482 B2 * 3/2017 Chen ....................... H01L 24/04
9,640,531 B1 * 5/2017 Or-Bach ........... H01L 21/76816
9,653,391 B1 * 5/2017 Yew .................... H01L 23/5389
9,659,805 B2 * 5/2017 Hu ...................... H01L 23/5389
9,666,502 B2 * 5/2017 Chen .................. H01L 25/0652
9,685,411 B2 * 6/2017 Chen ..................... H01L 23/544
9,735,131 B2 * 8/2017 Su ....................... H01L 25/0657
9,754,906 B2 * 9/2017 Tsai .................... H01L 23/5389
9,768,139 B2 * 9/2017 Chiu ................... H01L 23/3171
9,793,230 B1 * 10/2017 Yu ........................... H01L 24/20
9,824,990 B2 * 11/2017 Chen ................. H01L 23/49838
9,825,006 B2 * 11/2017 Miki .................. H01L 25/0657
9,825,007 B1 * 11/2017 Chen ................. H01L 23/49811
9,837,359 B1 * 12/2017 Chiu ....................... H01L 25/50
9,847,269 B2 * 12/2017 Lin ....................... H01L 23/295
9,859,229 B2 * 1/2018 Tsai .................... H01L 25/0657
9,859,254 B1 * 1/2018 Yu ........................... H01L 24/92
9,870,997 B2 * 1/2018 Chang ................. H01L 23/3128
9,899,248 B2 * 2/2018 Yu ....................... H01L 21/6835
9,911,672 B1 * 3/2018 Wu ..................... H01L 23/3128
9,922,895 B2 * 3/2018 Chiu ....................... H01L 21/78
9,922,896 B1 * 3/2018 Cheng ..................... H01L 24/19
9,935,080 B2 * 4/2018 Hung .................... H01L 21/486
9,935,090 B2 * 4/2018 Yu ....................... H01L 23/3675
9,960,137 B1 * 5/2018 Huang .................... H01L 24/81
9,966,360 B2 * 5/2018 Yu ........................ H01L 23/5384
9,978,657 B2 * 5/2018 Liu ......................... H01L 24/96
9,984,960 B2 * 5/2018 Hwang ............. H01L 23/49811
9,985,006 B2 * 5/2018 Jeng ...................... H01L 21/565
10,008,462 B2 * 6/2018 Seo ......................... H01L 24/02
10,043,770 B2 * 8/2018 Chen ....................... H01L 24/13
10,049,986 B2 * 8/2018 Liu ................... H01L 21/76895
10,068,853 B2 * 9/2018 Hu ........................ H01L 21/565
10,103,125 B2 * 10/2018 Yu .......................... H01L 23/562
10,115,647 B2 * 10/2018 Huang .............. H01L 23/49811
10,128,193 B2 * 11/2018 Chen ....................... H01L 24/20
10,134,708 B2 * 11/2018 Yu ..................... H01L 23/49894
10,141,288 B2 * 11/2018 Hsieh ...................... H01L 24/19
10,157,807 B2 * 12/2018 Chiang ................... H01L 24/24
10,157,846 B2 * 12/2018 Chen ................... H01L 23/5384
10,163,701 B2 * 12/2018 Lee ..................... H01L 23/5389
10,163,745 B2 * 12/2018 Chiu ................. H01L 21/76895
10,163,800 B2 * 12/2018 Chen ................... H01L 23/5384
10,163,813 B2 * 12/2018 Lin ..................... H01L 25/0657
10,163,866 B2 * 12/2018 Chen ....................... H01L 25/50
10,181,448 B2 * 1/2019 Hung ...................... H01L 24/11
10,325,853 B2 * 6/2019 Yu ........................... H01L 21/56
10,559,547 B2 * 2/2020 Shibata ................... H01L 24/14
10,622,310 B2 * 4/2020 Yang ................... H01L 23/5384
11,233,176 B2 * 1/2022 Lee ....................... H01L 33/387
2004/0266163 A1 * 12/2004 Horng ..................... H01L 24/13 438/614
2005/0017376 A1 * 1/2005 Tsai ........................ H01L 24/13 257/786
2005/0077624 A1 4/2005 Tan et al.
2006/0087034 A1 * 4/2006 Huang .................... H01L 24/05 257/737
2006/0138671 A1 * 6/2006 Watanabe ............... H01L 24/13 257/773
2006/0214293 A1 * 9/2006 Park .................... H01L 23/3114 257/737
2006/0226542 A1 * 10/2006 Chien ..................... H01L 24/11 257/737
2007/0205520 A1 * 9/2007 Chou ...................... H01L 24/48 257/780
2008/0042275 A1 * 2/2008 Kuan ...................... H01L 24/11 257/738
2008/0224326 A1 * 9/2008 Kuo ........................ H01L 24/05 257/780
2008/0233731 A1 * 9/2008 Lin ......................... H01L 28/40 438/597
2008/0308934 A1 * 12/2008 Alvarado ................ H01L 24/05 257/738
2009/0205202 A1 * 8/2009 Tanaka ................... H05K 1/188 29/834
2009/0206411 A1 * 8/2009 Koketsu .................. H01L 24/81 257/368
2009/0244865 A1 * 10/2009 Tanaka ................... H05K 1/185 361/764
2009/0283877 A1 * 11/2009 Tsai ........................ H01L 24/11 257/659
2010/0090352 A1 * 4/2010 Muramatsu ....... H01L 23/49827 257/778
2010/0133705 A1 * 6/2010 Fillion .............. H01L 21/76804 257/782
2011/0114986 A1 * 5/2011 Kojima ................. H01L 33/405 257/99
2011/0198747 A1 * 8/2011 Kuo .................... H01L 23/5256 257/737
2011/0204515 A1 * 8/2011 Fazelpour ............... H01L 24/13 257/738
2011/0233585 A1 * 9/2011 Kojima ................. H01L 33/486 257/98
2011/0272819 A1 * 11/2011 Park ........................ H01L 24/05 257/774
2011/0291288 A1 * 12/2011 Wu ......................... H01L 24/11 257/774
2012/0007230 A1 * 1/2012 Hwang ................... H01L 24/13 257/737
2012/0012985 A1 * 1/2012 Shen ....................... H01L 24/14 257/618

(56) References Cited

U.S. PATENT DOCUMENTS

2012/0061823 A1* 3/2012 Wu .................... H01L 23/3157 257/737
2012/0104604 A1* 5/2012 McCarthy .............. H01L 24/05 257/738
2012/0126368 A1* 5/2012 Chan ...................... H01L 23/66 257/531
2012/0129333 A1* 5/2012 Yim ....................... H01L 24/11 438/613
2012/0153462 A1* 6/2012 Wakiyama ............ H01L 23/544 257/737
2012/0280385 A1* 11/2012 Tain ................. H01L 29/41766 257/737
2012/0313236 A1* 12/2012 Wakiyama ............. H01L 25/50 257/734
2013/0026622 A1* 1/2013 Chuang .................. H01L 24/11 257/737
2013/0032923 A1* 2/2013 Lin .................... H01L 23/5227 257/531
2013/0043583 A1* 2/2013 Wu ........................ H01L 24/11 257/737
2013/0062760 A1* 3/2013 Hung ..................... H01L 24/97 257/738
2013/0093077 A1* 4/2013 Liang ............... H01L 21/76841 257/737
2013/0127052 A1* 5/2013 Tu ...................... H01L 23/3114 257/738
2013/0154108 A1* 6/2013 Lin .................. H01L 23/49816 257/774
2013/0168848 A1* 7/2013 Lin ........................ H01L 24/03 257/737
2013/0187270 A1* 7/2013 Yu .......................... H01L 25/50 257/737
2013/0249080 A1* 9/2013 Lin ...................... H01L 21/568 257/737
2013/0249082 A1* 9/2013 Chien .................. H01L 21/563 257/737
2013/0256876 A1* 10/2013 Lee ........................ H01L 24/13 257/737
2013/0264684 A1* 10/2013 Yu ........................ H01L 21/561 257/616
2013/0299967 A1* 11/2013 Daniels ................... H01L 24/03 257/737
2013/0307140 A1* 11/2013 Huang ............. H01L 23/49811 257/737
2013/0341784 A1* 12/2013 Lin ........................ H01L 24/20 257/737
2013/0341800 A1* 12/2013 Tu ........................ H01L 23/585 257/774
2014/0048906 A1* 2/2014 Shim .................... H01L 21/561 257/531
2014/0061897 A1* 3/2014 Lin ........................ H01L 24/14 257/737
2014/0070396 A1* 3/2014 Kyozuka ................ H01L 24/24 257/698
2014/0077374 A1* 3/2014 Lin .................... H01L 23/3114 257/741
2014/0117533 A1* 5/2014 Lei ......................... H01L 24/05 257/737
2014/0167254 A1* 6/2014 Yu .......................... H01L 24/11 257/737
2014/0252646 A1* 9/2014 Hung ................... H01L 21/486 257/774
2014/0287541 A1* 9/2014 Yasumura ........... H01L 21/6835 438/15
2014/0319522 A1* 10/2014 Daubenspeck ......... H01L 24/13 257/48
2014/0374899 A1* 12/2014 Yang ...................... H01L 24/13 257/737
2015/0048499 A1* 2/2015 Tai ..................... H01L 23/3192 257/737
2015/0098204 A1* 4/2015 Yoshikawa ....... H01L 23/49811 361/767
2015/0108645 A1* 4/2015 Daubenspeck ....... H01L 23/522 257/751
2015/0123266 A1* 5/2015 Wu ........................ H01L 24/09 257/737
2015/0145145 A1* 5/2015 Tsuyutani ............ H01L 21/561 257/774
2015/0187636 A1* 7/2015 Ho ................... H01L 21/76251 257/774
2015/0235977 A1* 8/2015 Shao .................... H01L 21/268 257/737
2015/0255406 A1* 9/2015 Miao ...................... H01L 24/11 257/684
2015/0262952 A1* 9/2015 Lee ........................ H01L 24/03 257/737
2015/0287697 A1* 10/2015 Tsai ....................... H01L 24/97 257/770
2015/0311132 A1* 10/2015 Kuo ....................... H01L 24/19 257/737
2015/0348904 A1* 12/2015 Huang ............... H01L 23/5389 257/774
2015/0349207 A1* 12/2015 Sogo .................. H01L 33/0093 257/99
2016/0005702 A1* 1/2016 Shih ................... H01L 23/5389 257/737
2016/0005707 A1* 1/2016 Kwon ................ H01L 25/0657 257/737
2016/0005716 A1* 1/2016 Yu ...................... H01L 23/3128 257/738
2016/0093572 A1* 3/2016 Chen .................... H01L 21/486 257/774
2016/0093580 A1* 3/2016 Scanlan ................. H01L 24/96 257/737
2016/0118297 A1* 4/2016 Chen ...................... H01L 24/03 438/127
2016/0163564 A1* 6/2016 Yu ...................... H01L 23/5386 257/774
2016/0163578 A1* 6/2016 Yu ...................... H01L 21/6835 257/738
2016/0190041 A1* 6/2016 Gong ............... H01L 21/76898 257/774
2016/0190098 A1* 6/2016 Chen ...................... H01L 21/78 257/774
2016/0276248 A1* 9/2016 Huang ............... H01L 23/5389
2016/0276278 A1* 9/2016 Tsai ....................... H01L 24/97
2016/0307788 A1* 10/2016 Hu ..................... H01L 21/2885
2016/0307861 A1* 10/2016 Lin ........................ H01L 24/05
2016/0307864 A1* 10/2016 Chiu ...................... H01L 24/05
2016/0351540 A1* 12/2016 Ogiso ..................... H01L 24/13
2016/0351543 A1* 12/2016 Ryu ................... H01L 25/0657
2016/0358900 A1* 12/2016 Lai ....................... H01L 21/481
2016/0372630 A1* 12/2016 Jang ....................... H01L 33/24
2016/0379747 A1* 12/2016 Wolter ................. H01F 41/046 336/200
2016/0379950 A1* 12/2016 Tsai ...................... H01L 25/105 257/737
2017/0005035 A1* 1/2017 Chen ...................... H01L 24/19
2017/0005052 A1* 1/2017 Chen ................ H01L 21/76885
2017/0005054 A1* 1/2017 Chiu .................... H01L 23/528
2017/0005067 A1* 1/2017 Yang ...................... H01L 24/81
2017/0018534 A1* 1/2017 Miki ..................... H01L 23/544
2017/0084589 A1* 3/2017 Kuo .................... H01L 23/3128
2017/0092581 A1* 3/2017 Chiu ................... H01L 21/4853
2017/0108173 A1* 4/2017 Kim ...................... G06F 1/1662
2017/0110421 A1* 4/2017 Liu ......................... H01L 24/97
2017/0125346 A1* 5/2017 Liu ..................... H01L 23/5386
2017/0133354 A1* 5/2017 Chen .................. H01L 25/0657
2017/0176804 A1* 6/2017 Choi ....................... H01L 24/14
2017/0188458 A1* 6/2017 Hsieh ..................... H05K 1/111
2017/0263821 A1* 9/2017 In ........................... H01L 33/62
2017/0271283 A1* 9/2017 Lee ......................... H01L 24/19
2017/0278814 A1* 9/2017 Hung ...................... H01L 24/13
2017/0323840 A1* 11/2017 Chiu ..................... H01L 21/561
2017/0338196 A1* 11/2017 Chiu ...................... H01L 25/10
2017/0345762 A1* 11/2017 Chiu ..................... H01L 25/105
2018/0013052 A1* 1/2018 Oliver ................. H01L 25/0652
2018/0017870 A1* 1/2018 Ge ...................... H01L 45/1233

(56) References Cited

U.S. PATENT DOCUMENTS

2018/0025986 A1* 1/2018 Chiu .................. H01L 21/6835
257/531
2018/0061669 A1* 3/2018 Liao .................. H01L 21/4857
2018/0061787 A1* 3/2018 Wu .................. H01L 23/13
2018/0076151 A1* 3/2018 Min .................. H01L 24/05
2018/0082988 A1* 3/2018 Cheng .................. H01L 21/561
2018/0090460 A1* 3/2018 Chu .................. H01L 23/562
2018/0096939 A1* 4/2018 Chiu .................. H01L 23/5386
2018/0096943 A1* 4/2018 Chiu .................. H01L 25/105
2018/0122761 A1* 5/2018 Huang .................. H01L 24/05
2018/0151493 A1* 5/2018 Ku .................. H01L 28/10
2018/0151495 A1* 5/2018 Hsu .................. H01L 23/49811
2018/0204780 A1* 7/2018 Chiu .................. H01L 23/3128
2018/0204813 A1* 7/2018 Ogumi .................. H01L 25/0657
2018/0233474 A1* 8/2018 Yu .................. H01L 24/13
2018/0301389 A1* 10/2018 Liu .................. H01L 24/14
2018/0337143 A1* 11/2018 Lu .................. H01L 24/17
2018/0350784 A1* 12/2018 Cheng .................. H01L 23/5389
2018/0366347 A1* 12/2018 Chuang .................. H01L 21/561
2018/0366410 A1* 12/2018 Chen .................. H01L 21/565
2018/0366412 A1* 12/2018 Hsieh .................. H01L 25/105
2018/0373079 A1* 12/2018 Yeh .................. H01L 27/124
2018/0374797 A1* 12/2018 Hu .................. H01L 23/5384
2018/0374822 A1* 12/2018 Yu .................. H01L 24/73
2018/0374824 A1* 12/2018 Yu .................. H01L 24/19
2019/0006306 A1* 1/2019 Shibata .................. H01L 23/3171
2019/0035759 A1* 1/2019 Tsai .................. H01L 24/25
2019/0067230 A1 2/2019 Liu et al.
2019/0109016 A1* 4/2019 Koduri .................. H01L 24/16
2019/0109105 A1* 4/2019 Koduri .................. H01L 23/544
2019/0109110 A1* 4/2019 Koduri .................. H01L 23/3121
2019/0123711 A1* 4/2019 Revier .................. H03H 3/0073
2019/0131249 A1* 5/2019 Hsieh .................. H01L 21/568
2019/0148343 A1* 5/2019 Yu .................. H01L 21/76898
257/48
2019/0164782 A1* 5/2019 Shih .................. H01L 24/17
2019/0311978 A1* 10/2019 Cheah .................. H05K 3/3436
2019/0312018 A1* 10/2019 Lai .................. H01L 24/11
2020/0013742 A1* 1/2020 Chen .................. H01L 24/11
2020/0066582 A1* 2/2020 Liao .................. H01Q 9/0407
2020/0251432 A1* 8/2020 Lin .................. H01L 24/05
2021/0135059 A1* 5/2021 Lee .................. H01L 33/62
2021/0287997 A1* 9/2021 Chen .................. H01L 23/5386
2021/0335715 A1* 10/2021 Kao .................. H01L 21/6835
2021/0358859 A1* 11/2021 Chen .................. H01L 25/16
2022/0028801 A1* 1/2022 Tien .................. H01L 23/5384
2022/0139854 A1* 5/2022 Chang .................. H01L 24/03
257/734
2022/0199509 A1* 6/2022 Huang .................. H01L 23/562
2022/0199538 A1* 6/2022 Lu .................. H01L 25/0655
2022/0302004 A1* 9/2022 Yen .................. H01L 23/49816

* cited by examiner

SEMICONDUCTOR DEVICE AND SEMICONDUCTOR PACKAGE

BACKGROUND

1. Technical Field

The present disclosure relates to a semiconductor device, and more particularly, to a semiconductor device including bumps and a semiconductor package comprising the device.

2. Description of the Related Art

In a semiconductor flip-chip bonding process, a chip is placed on a substrate (or another chip). The chip may be electrically connected to the substrate through metal bumps disposed on the chip, and through the bonding pads disposed on the substrate. Solder may be used to physically connect the metal bumps and the bonding pads.

Miniaturization has had a severe impact on the assembly stresses generated during molding of metal bumps on semiconductor devices. Such stresses may produce cracks in the bumps or even detachment of a chip or die, resulting in poor electrical connection between the chip and the substrate. Therefore, it would be desirable to provide a semiconductor device with improved bumps to reduce the assembly stresses generated during a molding process and prevent poor electrical connection between the chip and the substrate.

SUMMARY

In an aspect, a semiconductor device includes a semiconductor element; a protective layer disposed adjacent to the surface of the semiconductor element, the protective layer defining an opening to expose the semiconductor element; a first bump disposed on the semiconductor element; and a second bump disposed onto the surface of the protective layer. The first bump has larger cross-section surface area than the second bump.

In an aspect, a semiconductor device includes a semiconductor element; a first bump disposed proximal to a surface of the semiconductor element, wherein the first bump includes a first pillar and a first solder layer; and a second bump disposed proximal to the surface of the semiconductor element, wherein the second bump includes a second pillar and a second solder layer. The first pillar and the second pillar have substantially the same height, and the first solder layer and the second solder layer do not have substantially the same height. In addition, the first bump has larger cross-section surface area than the second bump.

In an aspect, a semiconductor package comprises a semiconductor device and a second semiconductor element. The semiconductor device comprises a first semiconductor element; a protective layer disposed adjacent to the surface of the first semiconductor element, the protective layer defining an opening to expose the first semiconductor element; a first bump disposed on the first semiconductor element; and a second bump disposed onto the surface of the protective layer, wherein the first bump has larger cross-section surface area than the second bump. The second semiconductor element comprises a first bonding pad disposed adjacent to a surface of the second semiconductor element and corresponding to the first pillar; wherein the first pillar is bonded to the first bonding pad.

In an aspect, a method of forming a semiconductor device, comprising: providing a semiconductor element, the semiconductor element comprising at least one bonding pad disposed adjacent to the surface of the semiconductor element; disposing a protective layer adjacent to the surface of the semiconductor element, the protective layer defining an opening to expose the bonding pad; disposing a first pillar on the bonding pad; and disposing a second pillar adjacent to the surface of the protective layer, wherein the first pillar has larger cross-section surface area than the second pillar.

BRIEF DESCRIPTION OF THE DRAWINGS

FIG. 2(*b*) illustrates a top view of the semiconductor device illustrated in FIG. 1 according to an embodiment of the present disclosure.

FIG. 3(*b*) illustrates a top view of the semiconductor device illustrated in FIG. 1 according to an embodiment of the present disclosure.

DETAILED DESCRIPTION

Spatial descriptions, such as "above," "top," "bottom," "higher," "lower," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

In a semiconductor flip-chip bonding process, a chip is placed on a substrate (or another chip). The chip may be electrically connected to the substrate through metal bumps disposed on the chip, and through the bonding pads disposed on the substrate. Solder may be used to physically connect the metal bumps and the bonding pads. A reflow process melts the solder so that the metal bumps can bond with the bonding pads, to form a flip-chip bonding structure. However, such bonding structures can be fragile, as assembly stress is often generated during the molding process of the metal bumps. The assembly stress may break the metal bump or even cause detachment of a chip or die. A result may be poor electrical connection between the chip and the substrate and low reliability.

The present disclosure provides for an improved semiconductor device with improved metal bumps that can reduce assembly stress which is often generated during the molding process of the metal bumps.

Figure 1:
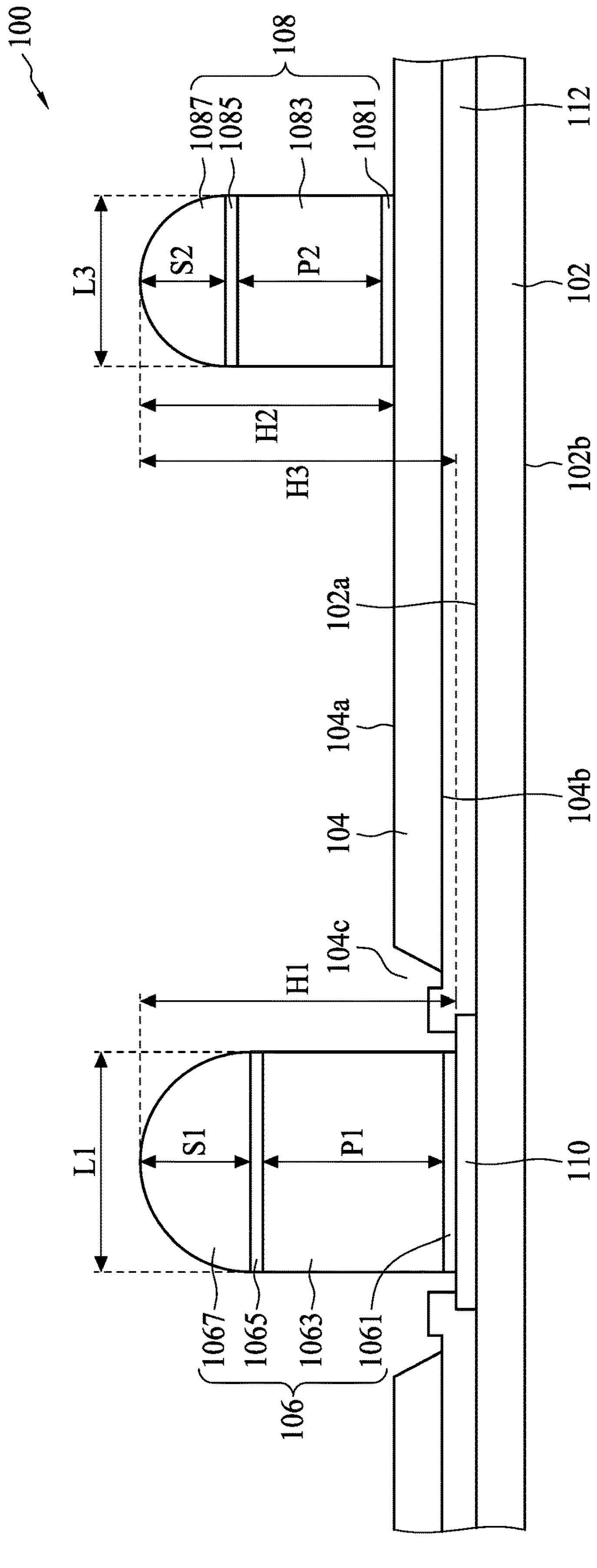
FIG. 1 illustrates a cross-sectional view of a semiconductor device according to an embodiment of the present disclosure.

FIG. 1 illustrates a cross-sectional view of a semiconductor device 100 according to an embodiment of the present disclosure. The semiconductor device 100 of FIG. 1 includes a semiconductor element 102, a protective layer 104, multiple first bumps 106, and multiple second bumps 108.

The semiconductor element 102 may be a die, a chip, a package, or an interposer. The semiconductor element 102 has a first surface 102*a*, a second surface 102*b* opposite to the first surface 102*a*, and one or more bonding pads 110. The bonding pad 110 is disposed adjacent to the first surface 102*a* of the semiconductor element 102. The bonding pad 110 may be, for example, a contact pad of a trace. In the embodiment of FIG. 1, the first surface 102*a* is an active surface, the bonding pad 110 is a contact pad, and the bonding pad 110 is disposed directly on the first surface 102*a* of the semiconductor element 102. The bonding pad 110 may include, for example, one of, or a combination of, copper, gold, indium, tin, silver, palladium, osmium, iridium, ruthenium, titanium, magnesium, aluminum, cobalt, nickel, or zinc, or other metals or metal alloys.

The protective layer 104 is disposed adjacent to the first surface 102*a* of the semiconductor element 102. As shown in FIG. 1, the protective layer 104 is disposed above the first surface 102*a* of the semiconductor element 102. The protective layer 104 defines one or more openings 104*c*. Each opening 104*c* corresponds to a respective bonding pad 110 and exposes at least a portion of the bonding pad 110. The protective layer 104 includes polyimide or other suitable materials (e.g., photosensitive materials). The protective layer 104 may be a passivation layer or an insulation layer (the material of which may be silicon oxide or silicon nitride, or another insulation material). In some embodiments, such as the one illustrated in FIG. 1, the protective layer 104 can be disposed on an insulation layer (or another protective layer) 112. The insulation layer (or another protective layer) 112 may cover a portion of the bonding pad 110 and cover the first surface 102*a* of the semiconductor element 102.

The first bump 106 is a conductive column structure. The first bump 106 is disposed proximal to the first surface 102*a* of the semiconductor element 102. The first bump 106 illustrated in FIG. 1 is disposed on the exposed portion of the illustrated bonding pad 110. As seen in FIG. 1, the first bump 106 may include a first under bump metallization (UBM) layer 1061, a first pillar 1063, a first barrier layer 1065, and a first solder layer 1067. In some embodiments, one, two, or three of the first UBM layer 1061, the first barrier layer 1045, and the first solder layer 1047 are omitted from the first bump 106 (e.g., the first bump is a pillar).

The second bump 108 is a conductive or an insulated column structure. The second bump is disposed proximal to the first surface 102*a* of the semiconductor element 102. The second bump 108 is disposed adjacent to the surface 104*a* of the protective layer 104. The second bump 108 illustrated in FIG. 1 is disposed onto the surface 104*a* of the protective layer 104. As seen in FIG. 1, the second bump 108 may include a second under bump metallization (UBM) layer 1081, a second pillar 1083, a second barrier layer 1085, and a second solder layer 1087. In some embodiments, one, two, or three of the second UBM layer 1081, the second barrier layer 1085, and the second solder layer 1087 are omitted from the second bump 108 (e.g., the first bump is a pillar). As described above, bonding structures can be fragile, as assembly stress is often generated during the molding process of the metal bumps. Therefore, the second bump 108 is disposed adjacent to the surface 104*a* of the protective layer 104 to share and reduce the assembly stress generated to the first bump 106 during the molding process of the metal bumps. Accordingly, breakage of the first bump 106 or detachment of the chip die that may be generated during the molding process of the metal bumps can be reduced or eliminated, and the electrical connection and reliability may correspondingly be improved.

As seen in FIG. 1, the second bump 108 is disposed at a plane higher than the first bump 106. As a result, if the first bump 106 and the second bump 108 have the same height (e.g., the first UBM layer 1061 and the second UBM layer 1081 have the same height; the first pillar 1063 and the second pillar 1083 have the same height; the first barrier layer 1065 and the second barrier layer 1085 have the same height; and the first solder layer 1067 and the second solder layer 1087 have the same height), there will be a height difference between the top of the first bump 106 and that of the second bump 108. Such height difference may cause poor co-planarity, and in turn poor solder connection, leading to a poor electrical connection. Thus, the present disclosure further provides that the first bump 106 should have larger cross-section surface area than the second bump 108 so that the height S1 of the first solder layer 1067 after reflow can be greater than the height S2 of the second solder layer 1087, so the difference between the first height H1 of the first bump 106 which is measured from the surface of the first bump 106 in contact with the semiconductor element 102 to the top of the first bump 106 and the third height H3 measured from the bottom of the first bump 106 to the top of the second bump 108 can be controlled to be less than 15 μm, less than 12 μm, less than 8 μm, or substantially the same after solder reflow (e.g., within manufacturing tolerances).

It is surprisingly found that a solder layer will have a smaller thickness after reflow if it is disposed on a pillar with a greater cross-section surface area. This may be associated with the surface tension between the solder layer 1067, 1087 and the barrier layer 1065, 1085 and/or the pillar 1063, 1083 underneath.

Figure 2A:
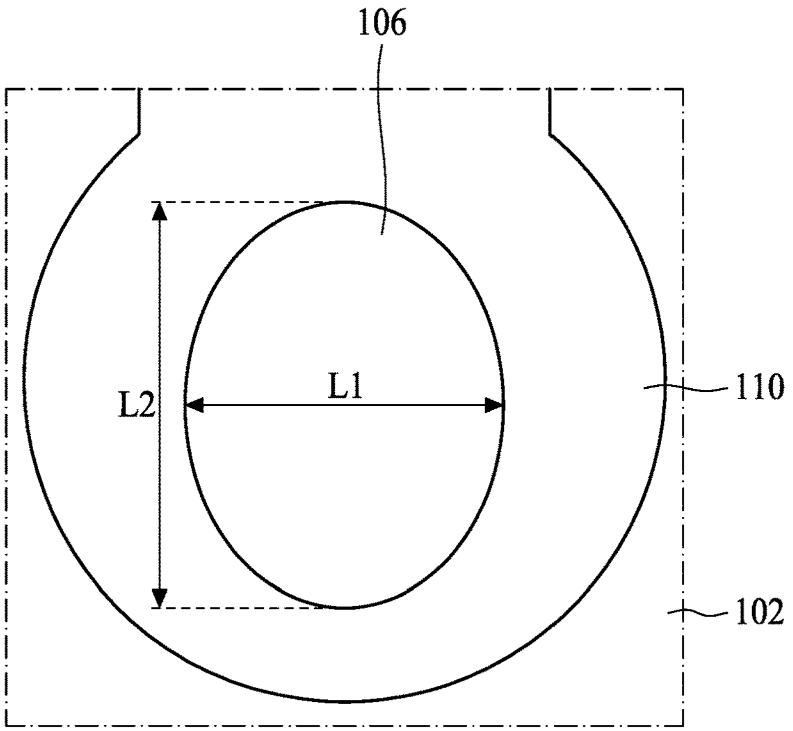
FIG. 2(*a*) illustrates a top view of the semiconductor device illustrated in FIG. 1 according to an embodiment of the present disclosure.
Figure 2B:
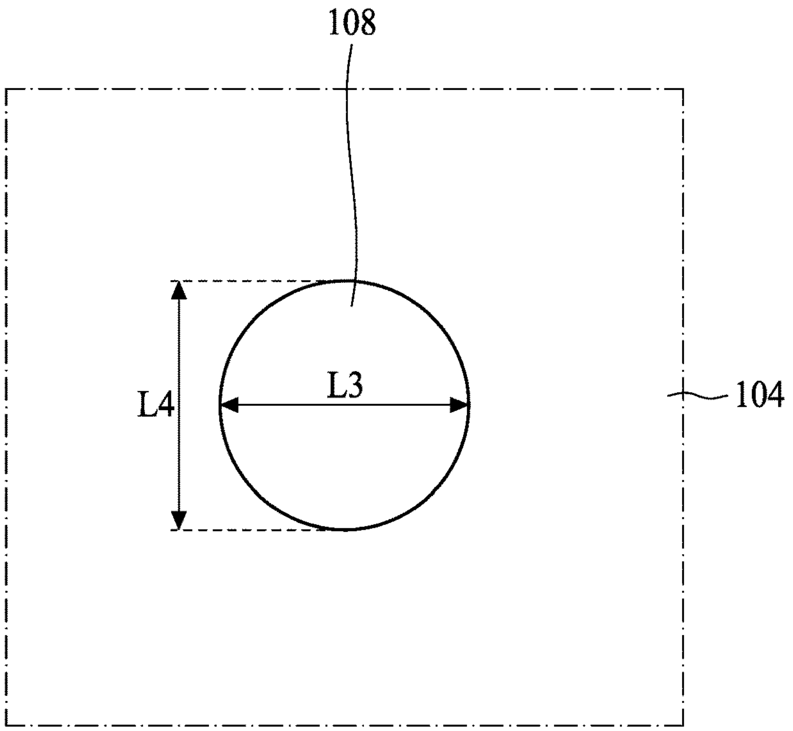

FIG. 2(*a*) illustrates a top view of an embodiment of the semiconductor device of FIG. 1, with the first bump 106 (including the pillar 1063) positioned on the bonding pad 110 on the semiconductor element 102. The first bump 106 may be in any shape as long as the first bump 106 has greater cross-section surface area than the second bump 108. In some embodiments, the first bump 106 has a circular or circular-like shape or an oval or oval-like shape. The first bump 106 has a first length L1 with respect to a first direction and a second length L2 with respect to a second direction. The first length L1 may be longer, shorter than, or equal to the second length L2. The first bump 106 illustrated in FIG. 2(*a*) has an oval or oval-like shape, where a ratio of the first length L1 to the second length L2 is about 1:1.2, about 1:1.5, about 1:1.7, about 1:1.9, or about 1:2.

FIG. 2(*b*) illustrates a top view of an embodiment of the semiconductor device of FIG. 1, with the second bump 108 (including the pillar 1083) positioned on the protective layer 104. The second bump 108 may be in any shape as long as the second bump 108 has smaller cross-section surface area than the first bump 106. In some embodiments, the second bump 108 has a circular or circular-like shape or an oval or oval-like shape. The second bump 108 has a third length L3 with respect to a first direction and a fourth length L4 with respect to a second direction. The third length L3 may be longer, shorter than, or equal to the fourth length L4. The second bump 108 illustrated in FIG. 2(*b*) has a circular or circular-like shape, where a ratio of the third length L3 to the fourth length L4 is about 1:1.

The first bump 106 may have a shape different from a shape of the second bump 108 or have a shape same or similar to a shape of the second bump 108. In some embodiments, the third length L3 of the second bump 108 falls within a range from 90% to 110% of the difference between the first length L1 of the first bump 106 and about 10 μm (e.g., when the first bump 106 has an oval or oval-like shape and the second bump 108 has a circular or circular-like shape). In some embodiments, the third length L3 of the second bump 108 falls within a range from 90% to 110% of the product of the first length and 0.7 (e.g., when the first bump 106 has a circular or circular-like shape and the second bump 108 has a circular or circular-like shape). In the embodiment illustrated in FIG. 2(*a*), FIG. 2(*b*), and FIG. 1, the first bump 106 has a shape different from the shape of the second bump 108. The first bump 106 has an oval or oval-like shape and the second bump 108 has a circular or circular-like shape.

A cap ratio can be determined by the thickness of the solder layer 1067, 1087 to the length L1, L3 of the bump 106, 108 with respect to a first direction. The cap ratio is determined depending on the design specifications. If a cap ratio of a solder layer is greater than 0.8, the solder layer may collapse and may not achieve its purpose of providing effective electrical connection. On the other hand, if a cap ratio of a solder layer is less than 0.3, the solder layer may expose the pillar underneath, which also may not achieve its purpose of providing effective electrical connection. In some embodiments, the first solder layer 1067 has a cap ratio of about 0.55 to about 0.65, a cap ratio of about 0.57 to about 0.63, or a cap ratio of about 0.58 to about 0.59. In some embodiments, the second solder layer 1087 has a cap ratio of about 0.50 to about 0.70, a cap ratio of about 0.52 to about 0.68, or a cap ratio of about 0.53 to about 0.66. In some embodiments, the first solder layer 1067 has a cap ratio of 0.55 to 0.65 and the second solder layer 1087 has a cap ratio of 0.50 to 0.70 (e.g., when the first bump 106 has an oval or oval-like shape and the second bump 108 has a circular or circular-like shape). In some embodiments, the first solder layer 1067 has a cap ratio of 0.55 to 0.65 and the second solder layer 1087 has a cap ratio of 0.60 to 0.80 (e.g., when the first bump 106 has a circular or circular-like shape and the second bump 108 has a circular or circular-like shape).

Figure 3A:
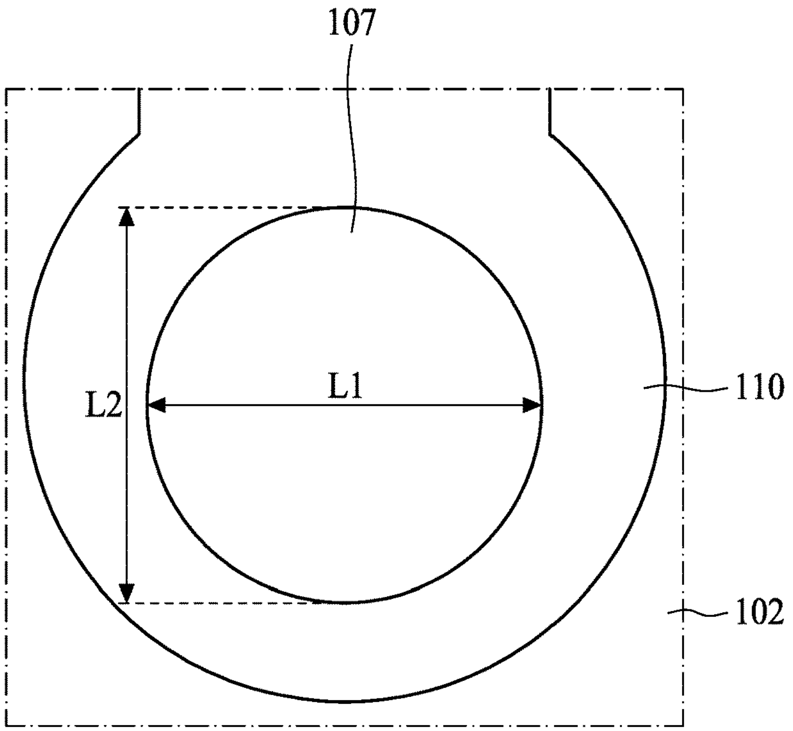
FIG. 3(*a*) illustrates a top view of the semiconductor device illustrated in FIG. 1 according to an embodiment of the present disclosure.
Figure 3B:
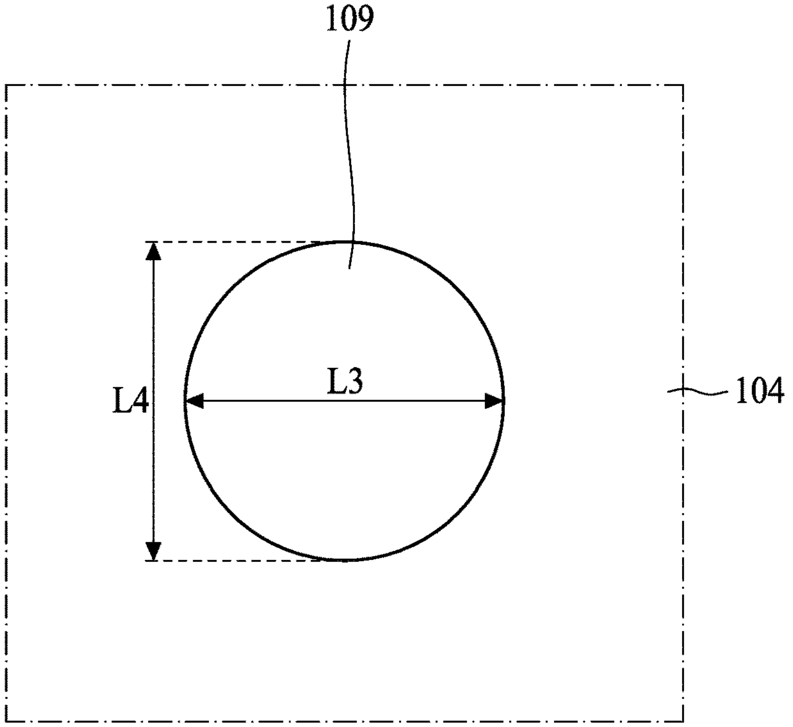

FIG. 3(*a*) illustrates a top view of an embodiment of the semiconductor device of FIG. 1, with a first bump 107 positioned on the bonding pad 110 on the semiconductor element 102. The semiconductor device is similar to that illustrated in FIG. 1, with a difference being that the first bump 107 in FIG. 3(*a*) has a circular or circular-like shape, where a ratio of the first length L1 to the second length L2 is about 1:1.

FIG. 3(*b*) illustrates a top view of an embodiment of the semiconductor device of FIG. 1, with a second bump 109 positioned on the protective layer 104. The semiconductor device and the second bump 109 are similar to those illustrated in FIG. 1, with a difference being that the third length L3 of the second bump 109 falls within a range from 90% to 110% of the product of the first length L1 of the first bump 107 illustrated in FIG. 3(*a*) and 0.7.

Figure 4:
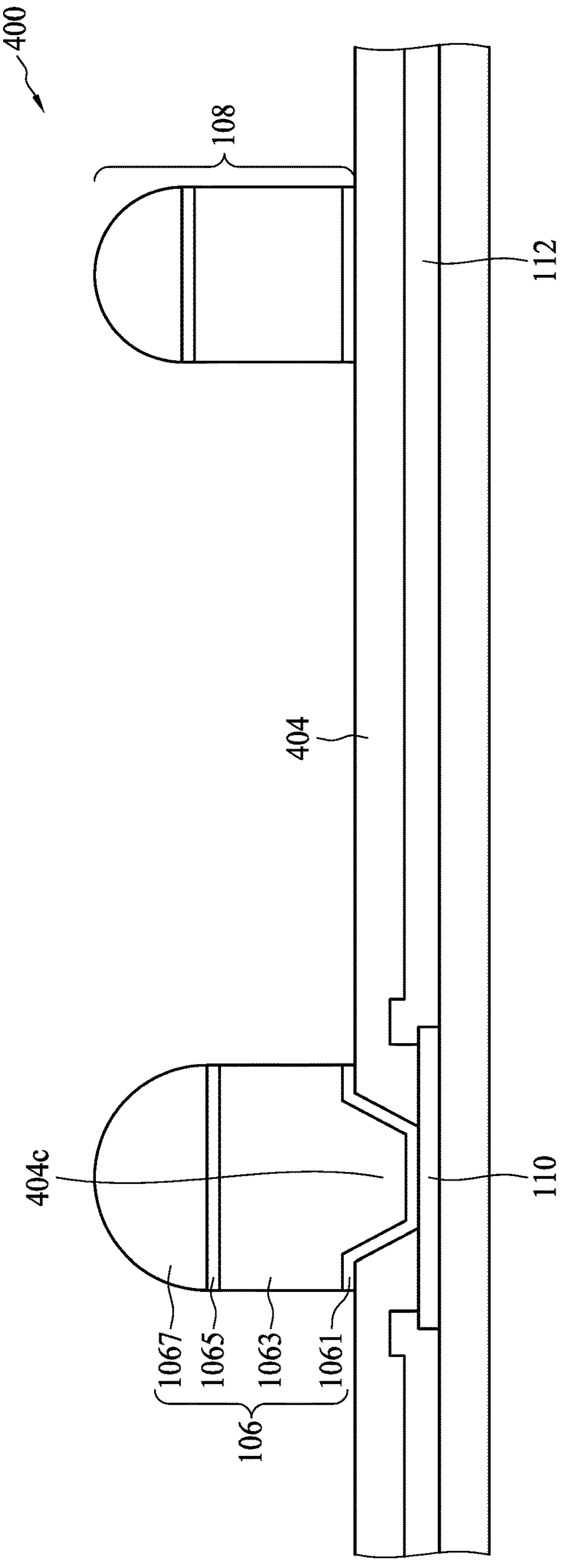
FIG. 4 illustrates a cross-sectional view of a semiconductor device according to an embodiment of the present disclosure.

FIG. 4 illustrates a cross-sectional view of a semiconductor device according to an embodiment of the present disclosure. The semiconductor device 400 in FIG. 4 is similar to the semiconductor device 100 in FIG. 1, with differences including that the protective layer 404 covers a portion of the bonding pad 110. The protective layer 404 has or defines one or more openings 404*c*. Each opening 404*c* corresponds to a respective bonding pad 110 and exposes at least a portion of the bonding pad 110. In the embodiment of FIG. 4, the first bump 106 is disposed on the exposed portion of the illustrated bonding pad 110 and on a portion of the protective layer 404.

Figure 5:
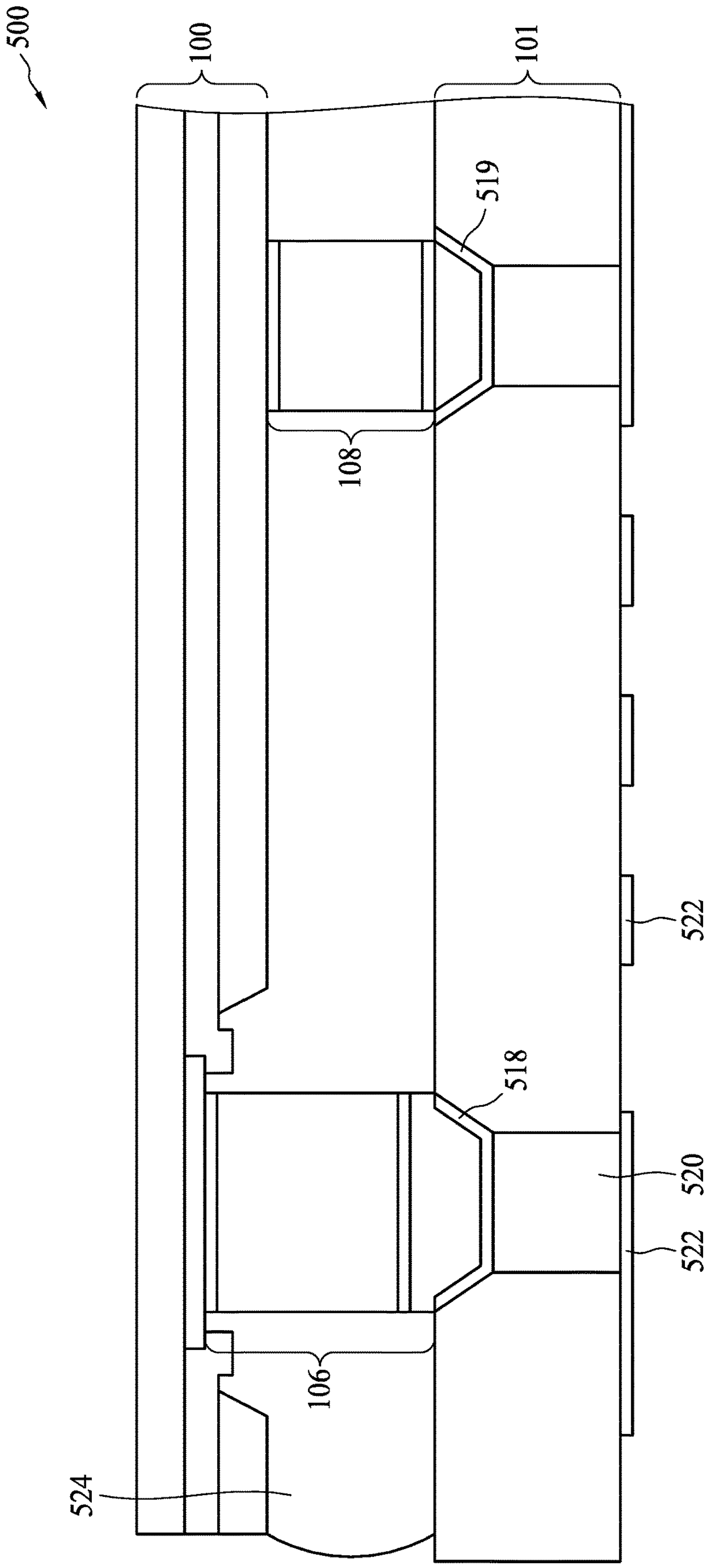
FIG. 5 illustrates a cross-sectional view of an embodiment of a semiconductor package according to an embodiment of the present disclosure.

FIG. 5 illustrates a cross-sectional view of an embodiment of a semiconductor package 500 including the semiconductor device 100 of FIG. 1. The semiconductor package 500 of FIG. 5 includes the semiconductor device 100 of FIG. 1, a second semiconductor element 101, an underfill 524, and a plurality of connecting elements 522 for external connection.

The second semiconductor element 101 may be a chip, a substrate, a package, or an interposer. The second semiconductor element 101 includes a second bonding pad 518 and a third bonding pad 519 disposed adjacent to a surface of the second semiconductor element 101. As seen in FIG. 5, the second bonding pad 518 may electrically connect to the external environment through a conductive via 520 and a connecting element 522 (e.g., a bonding bond and/or trace) provided on the second semiconductor element 101. The second bonding pad 518, 519 may include, for example, one of, or a combination of, copper, gold, indium, tin, silver, palladium, osmium, iridium, ruthenium, titanium, magnesium, aluminum, cobalt, nickel, or zinc, or other metals or metal alloys.

The semiconductor device 100 may be electrically connected to the second semiconductor element 101 through the first bump 106 disposed on the semiconductor device 100 and through the second bonding pad 518 disposed adjacent to the surface of the second semiconductor element 101. The second bump 108 may be thermally or insulated connected to the second semiconductor element 101 through the second bump 108 disposed on the semiconductor device 100 and through the third bonding pad 519 disposed on the second semiconductor element 101. It should be noted that the third bonding pad 519 may be omitted. In some embodiments, the semiconductor device 100 may be thermally connected to the second semiconductor element 101 through the second bump 108 disposed on the semiconductor device 100 and through the third bonding pad 519 disposed adjacent to the surface of the second semiconductor element 101. In these embodiments, the heat from the semiconductor device 100 may be dissipated through the second bump 108 and the third bonding pad 519.

The underfill 524 is disposed between the semiconductor device 100 and the second semiconductor element 101 to protect the first bump 106 from oxidation, moisture, and other environment conditions to meet the packaging application specifications. In some embodiments, the underfill 524 is disposed between the semiconductor device 100 and the second semiconductor element 101 to protect the first bump 106 and the second bump 108 from oxidation, moisture, and other environment conditions. It should be noted that the underfill 524 may be omitted.

Figure 6:
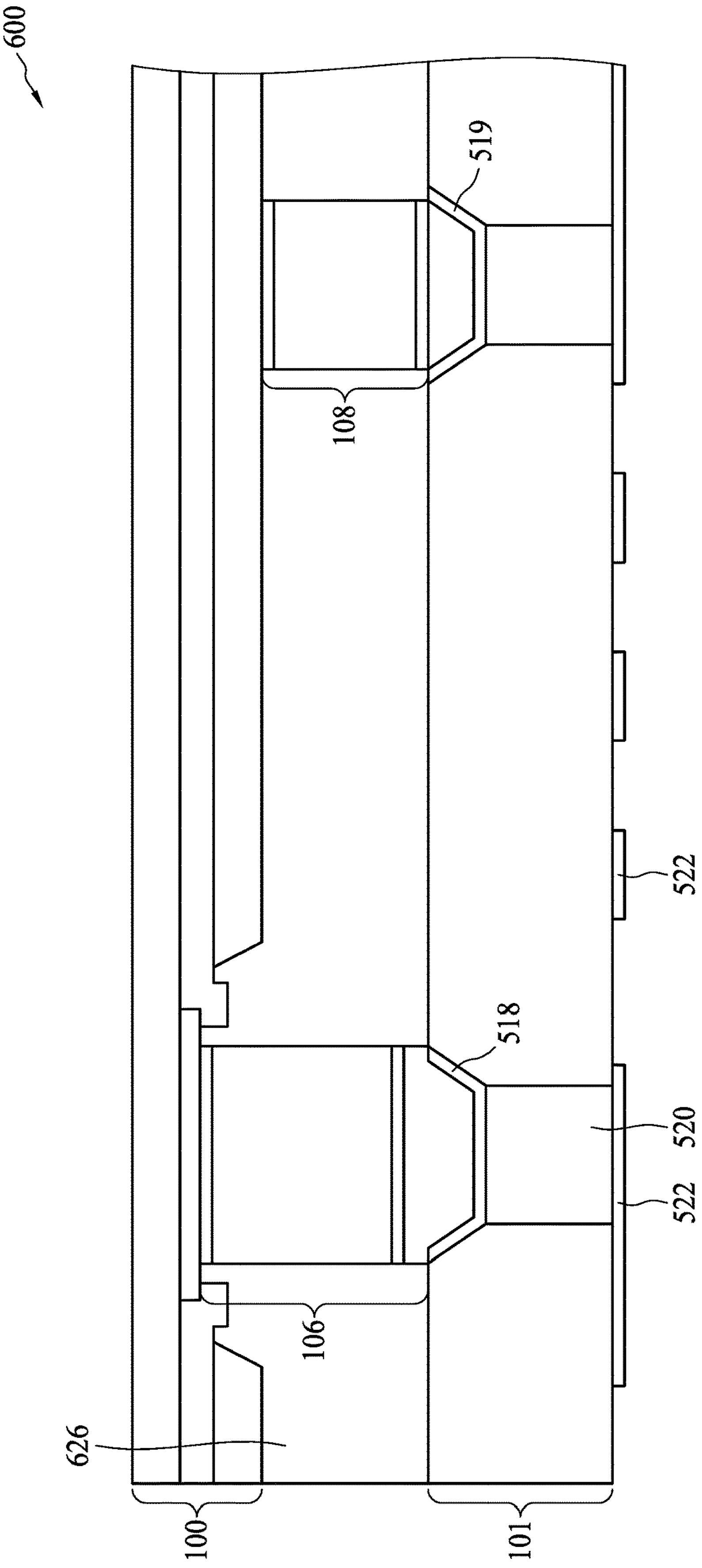
FIG. 6 illustrates a cross-sectional view of an embodiment of a semiconductor package according to an embodiment of the present disclosure.
Figure 7A:
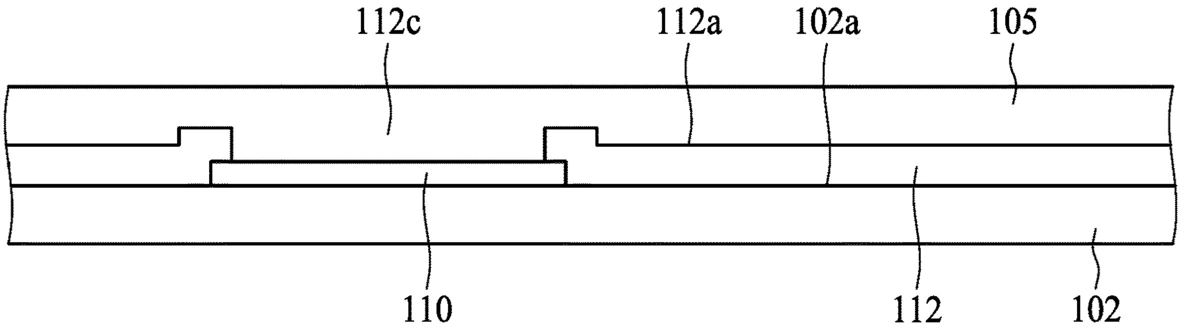
FIG. 7(*a*), FIG. 7(*b*), FIG. 7(*c*), FIG. 7(*d*), FIG. 7(*e*), and FIG. 7(*f*) illustrate a manufacturing method in accordance with an embodiment of the present disclosure.
Figure 7B:
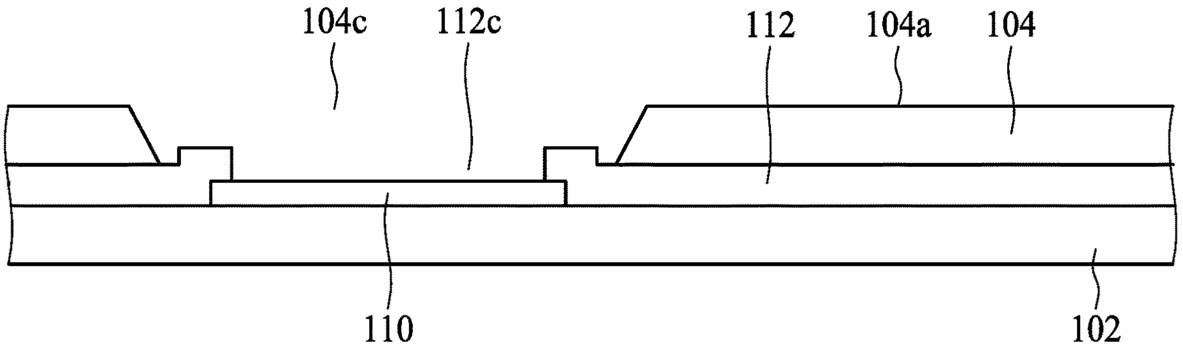
Figure 7C:
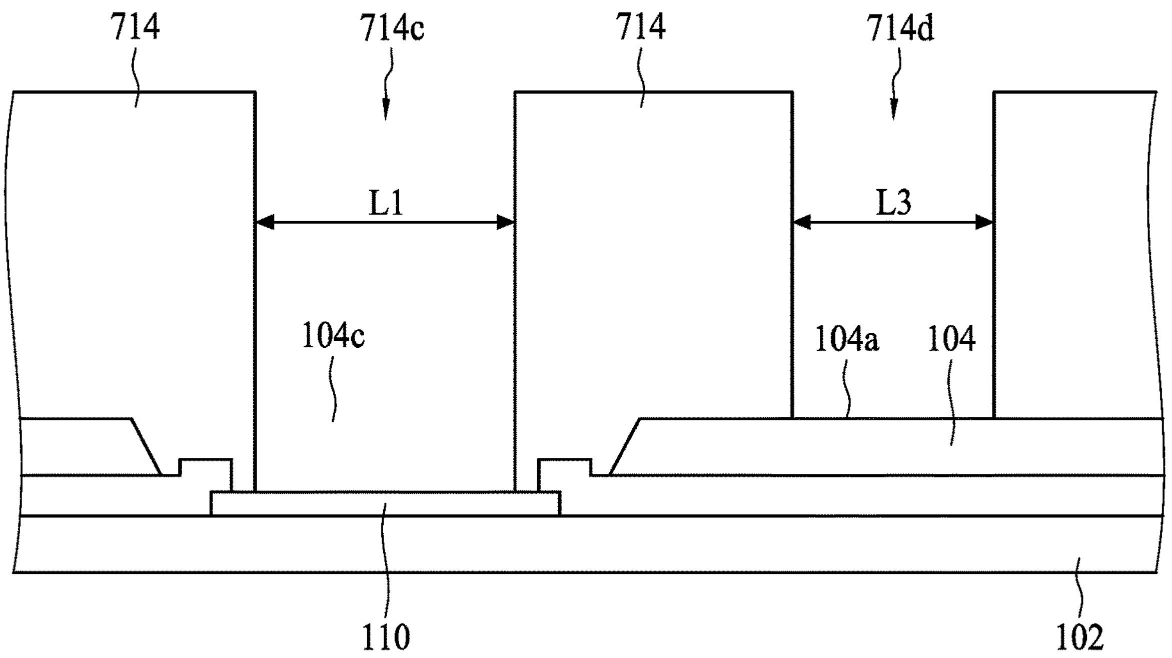
Figure 7D:
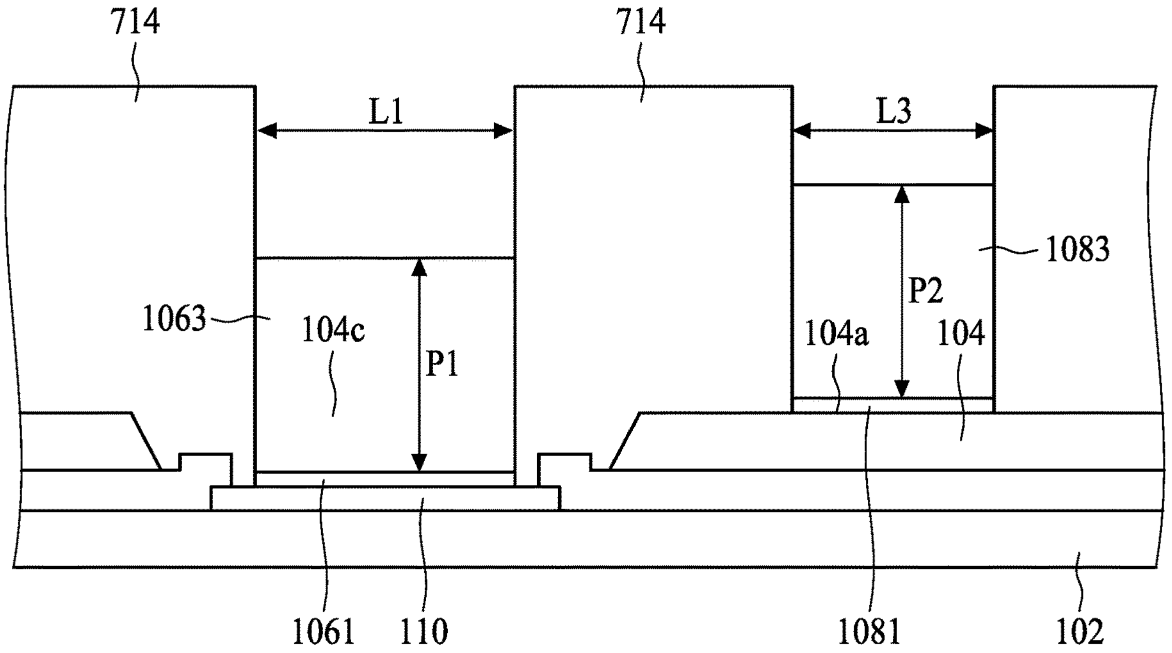
Figure 7E:
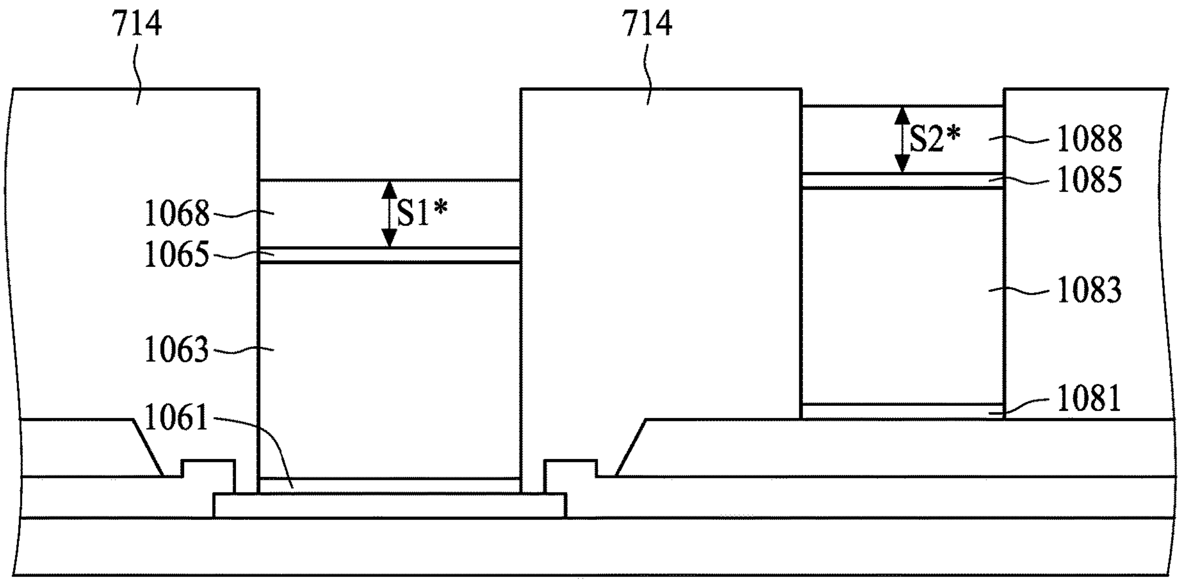
Figure 7F:
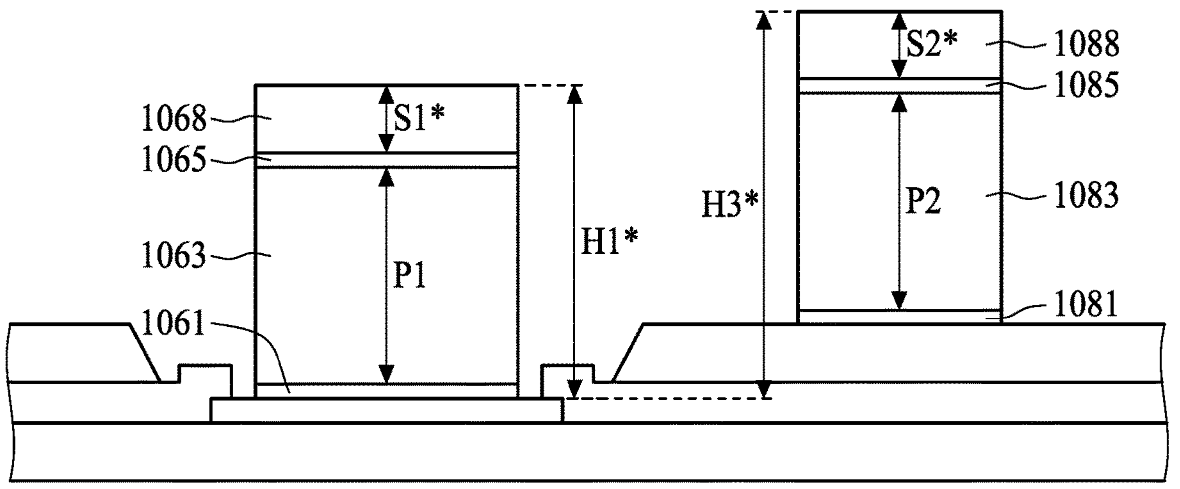

FIG. 6 illustrates a cross-sectional view of a semiconductor package 600 according to an embodiment of the present disclosure. The semiconductor package 600 is similar to the semiconductor package 500 illustrated in FIG. 5 except that a second insulation layer 626 is disposed between the semiconductor device 100 and the second semiconductor element 101 to protect the first bump 106 from oxidation, moisture, and other environment conditions to meet the packaging application specifications. In some embodiments, the second insulation layer 626 is disposed between the semiconductor device 100 and the second semiconductor element 101 to protect the first bump 106 and the second bump 108 from oxidation, moisture, and other environment conditions. In this embodiment, the second insulation layer 626 is a molding layer comprising a molding compound.

FIGS. 7(*a*)-7(*f*) illustrate a method for manufacturing a semiconductor device such as the semiconductor device 100 of FIG. 1.

Referring to FIG. 7(*a*), a semiconductor element (e.g., a die) 102 is provided. The semiconductor element 102 includes at least one bonding pad 110 on an active surface 102*a* of the semiconductor element 102. Each semiconductor element 102 may include a substrate, one or more integrated circuit devices, and one or more overlying interconnection structures therein. The integrated circuit devices may include one or more active devices such as transistors and/or passive devices such resistors, capacitors, inductors or a combination of two or more thereof.

An insulation layer (or a protective layer) 112 is disposed on the active surface 102*a* of the semiconductor element 102. The insulation layer 112 has or defines one or more openings 112*c* to expose the bonding pad 110. In some embodiments, the insulation layer 112 may cover a portion of the bonding pad 110. Alternatively, the insulation layer 112 fully exposes the bonding pad 110. In some embodiments, the opening 112*c* can be formed by, e.g., routing, etching or other suitable processes. In some embodiments, the insulation layer 112 is a passivation layer including silicon oxide, silicon nitride, gallium oxide, aluminum oxide, scandium oxide, zirconium oxide, lanthanum oxide, hafnium oxide, or another metal or non-metal oxide or nitride.

A protective layer 105 is disposed adjacent to the active surface 102*a* of the semiconductor element 102. In the embodiment illustrated in FIG. 5, the protective layer 105 is disposed on the surface 112*a* of the insulation layer 112 and covers the bonding pad 110. In some embodiments, a thickness of the protective layer 105 is about 3 μm to about 7 μm or about 4 μm to about 7 μm. In some embodiments, the protective layer 105 includes polyimide or other suitable materials (e.g., photosensitive materials).

Referring to FIG. 7(*b*), an opening 104*c* is formed to expose the bonding pad 110 and a portion of the insulation layer 112. As shown in FIG. 5, a width of the opening 104*c* is greater than a width of the opening 112*c*. Alternatively, the width of the opening 104*c* may be less than or substantially equal to the width of the opening 112*c* depending on design specifications. In some embodiments, the opening 104*c* can be formed by photolithography, etching, laser drilling, or other suitable processes.

Referring to FIG. 7(*c*), a patterned mask 714 is disposed adjacent to the surface 104*a* of the protective layer 104 to expose a portion of the bonding pad 110 and a portion of the protective layer 104. The patterned mask 714 defines or has a first opening 714*c* to expose a portion of the bonding pad 110 and defines or has a second opening 714*d* to expose a portion of the protective layer 104. The first opening 714*c* has a first width L1 from one side of the opening 714*c* to the opposite side of the opening 714*c* and has a second width L3 from one side of the opening 714*d* to the opposite side of the opening 714*d*, where the first width L1 is greater than the second width L2. The patterned mask 1401 may be formed, for example, by a photolithography technique.

Referring to FIG. 7(*d*), a first UBM layer 1061 is formed on the exposed portion of the bonding pad 110 and a second UBM layer 1081 is formed on the exposed portion of the protective layer 104. The first UBM layer 1061 and the second UBM layer 1081 may be formed with substantially the same height. The first UBM layer 1061 and the second UBM layer 1081 may be formed, for example, by a plating technique. The first UBM layer 1061 and the second UBM layer 1081 may independently include, but is not limited to, a metal, metal alloy, multi-metal or multi-alloy stack, such as a multi-alloy stack including, for example, a combination of copper, nickel, vanadium, chromium, and gold.

A first pillar 1063 with a first height P1 is formed on the first UBM layer 1061 and a second pillar 1083 with a second height P2 is formed on the second UBM layer 1081. The first height P1 may be greater, smaller than, or equal to the second height P1. In the embodiment illustrated in FIG. 7(*d*), the first height P1 and the second height P2 are substantially the same. The first pillar 1063 and the second pillar 1083 may be formed, for example, by a plating technique. The first pillar 1063 and the second pillar 1083 may independently include, but is not limited to, copper or another suitable metal or an alloy thereof.

Referring to FIG. 7(*e*), a first barrier layer 1065 is formed on the first pillar 1063 and a second barrier layer 1085 is formed on the second pillar 1083. The first barrier layer 1065 and the second barrier layer 1085 may be formed with substantially the same height. The first barrier layer 1065 and the second barrier layer 1085 may be formed, for example, by a plating technique. The first barrier layer 1065 and the second barrier layer 1085 may independently include, but is not limited to, nickel, copper, an alloy thereof, or another suitable metal or alloy.

In addition, a first solder layer 1068 with a first height S1* is formed on the first barrier layer 1065 and a second solder layer 1088 with a second height S2* is formed on the second barrier layer 1085. The first height S1* may be greater, smaller than, or equal to the second height S2*. In the embodiment illustrated in FIG. 7(*e*), the first height S1* and the second height S2* are substantially the same. The solder layer 1047*a* may be formed, for example, using photolithography and etching techniques.

Referring to FIG. 7(*f*), the patterned mask 714 is removed. Then, the first solder layer 1068 and the second solder layer 1088 are reflowed to form a semiconductor device 100 as illustrated in FIG. 1. As seen in FIG. 7(*f*), the first height H1* which is measured from the surface of the first UBM layer 1061 in contact with the semiconductor element 102 to the top of the first solder layer 1068 is smaller than the third height H3* measured from the bottom of the surface of the first UBM layer 1061 in contact with the semiconductor element 102 to the top of the second solder layer 1088 before the solder reflow as the second pillar 1083 is disposed on a plane higher than the first pillar 1063 and the first height S1* and the second height S2* are substantially the same, the first height P1 and the second height P2 are substantially the same, and the thickness of the first UBM layer 1061 together with the first barrier layer 1065 and that of the second UBM layer 1081 together with the second barrier layer 1085 are substantially the same.

Figure 8A:
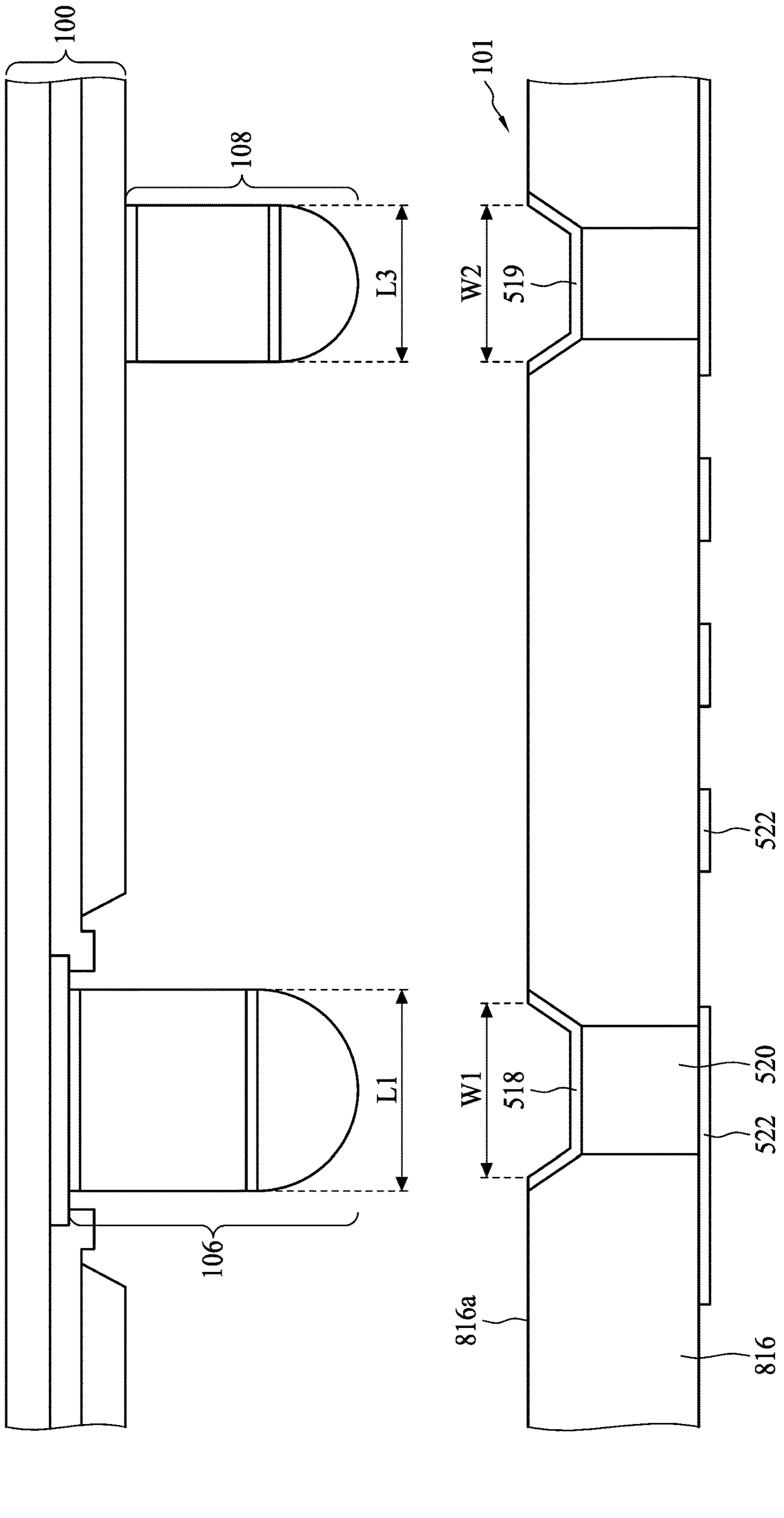
FIG. 8(*a*) and FIG. 8(*b*) illustrate a manufacturing method in accordance with an embodiment of the present disclosure.
Figure 8B:
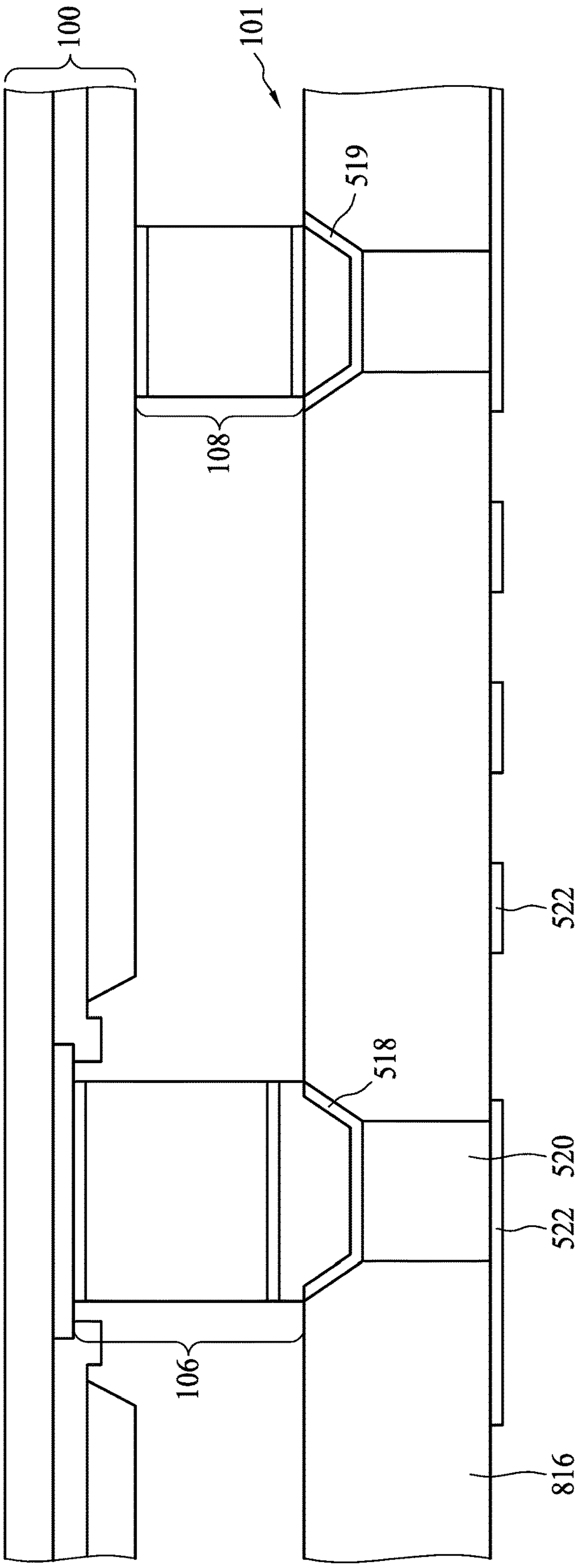

FIGS. 8(*a*)-8(*b*) illustrate a method for manufacturing a semiconductor package such as the semiconductor device 500 of FIG. 5.

Referring to FIG. 8(*a*), the semiconductor device 100 and the semiconductor element 101 are provided. The semiconductor device 100 of FIG. 8(*a*) is the same as the semiconductor device of FIG. 1 and has the first bump 106 and the second bump 108. The first bump 106 has a first length L1 with respect to a first direction and the second bump 108 has a third length L3 with respect to a first direction.

The second semiconductor element 101 of FIG. 8(*a*) is the same as second semiconductor element 101 of FIG. 5 and has the second bonding pad 518 and the third bonding pad 519 disposed adjacent to a surface of the second semiconductor element 101. The first bonding pad 518 corresponds to the first pillar 106 and has a first width W1, where the first width W1 is greater or equal to the first length L1 of the first bump 106. The second bonding pad 519 corresponds to the second pillar 108 and has a second width W2, where the second width W2 is greater or equal to the second length L2 of the second bump 108. The first width W1 is greater than the second width W2 as the first length L1 is greater than the second length L2.

Referring to FIG. 8(*b*), the first pillar 106 of the semiconductor device 100 is bonded to the first bonding pad 518 of the second semiconductor element 101 and the second pillar 108 of the semiconductor device 100 is bonded to the second bonding pad 519 of the second semiconductor element 101. The bonding process may be formed by thermo-compression bonding. Then, an underfill 524 is disposed between the semiconductor device 100 and the second semiconductor element 101 to form a semiconductor package 500 as illustrated in FIG. 5.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 μm, no greater than 1 μm, or no greater than 0.5 μm.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device, comprising:

a substrate comprising a pad disposed on a surface of the substrate;

a first protective layer disposed over the surface of the substrate, the first protective layer comprising an opening to expose the pad;

a second protective layer disposed between the first protective layer and the substrate, wherein the second protective layer comprises a top surface comprising an upper portion and a lower portion neither level with nor contacting the upper portion, wherein the first protective layer is disposed on the lower portion of the second protective layer and not on the upper portion of the second protective layer;

a first bump comprising a first pillar disposed on the pad and a first reflowable material on the first pillar; and a second bump disposed outside the opening and comprising a second pillar disposed on the first protective layer, and comprising a second reflowable material on the second pillar, wherein an elevation of a top surface of the first pillar is lower than an elevation of a top surface of the second pillar, and wherein a thickness of the first reflowable material is greater than a thickness of the second reflowable material.

2. The semiconductor device of claim 1, wherein a height of the first pillar is substantially equal to a height of the second pillar.

3. The semiconductor device of claim 1, wherein a cross-section surface area of the first reflowable material is greater than a cross-section surface area of the second reflowable material from a top view perspective.

4. The semiconductor device of claim 1, wherein a cross-section of the first bump is geometrically distinguishable from a cross-section of the second bump from a top view perspective.

5. The semiconductor device of claim 4, wherein the cross-section of the first bump comprises a first length substantially along a minor axis of the cross-section of the first bump and a second length substantially along a major axis of the cross-section of the first bump, and wherein the first length is shorter than the second length from the top view perspective.

6. The semiconductor device of claim 5, wherein the second bump comprises a third length on the cross-section of the second bump, the third length is substantially parallel to the minor axis of the first bump and substantially penetrating a center of the cross-section of the second bump, and the third length is shorter than the first length from the top view perspective.

7. The semiconductor device of claim 6, wherein a radial distance between an edge of the first bump and an edge of the pad gradually reduces from a location passing by the minor axis toward a location passing by the major axis from the top view perspective.

8. The semiconductor device of claim 5, wherein the major axis of the cross-section of the first bump is substantially parallel to an extending direction of a trace connected to the pad.

9. The semiconductor device of claim 1, wherein the upper portion of the top surface contacts an inner sidewall of the second protective layer facing the first pillar and contacts an outer sidewall of the second protective layer facing the first protective layer, wherein the lower portion of the top surface is partially exposed from the first protective layer.

10. The semiconductor device of claim 9, wherein an inner sidewall of the first protective layer is tapered from a top surface of the first protective layer toward a top surface of the second protective layer.

11. The semiconductor device of claim 9, wherein the inner sidewall of the second protective layer is free from contacting the first protective layer.

12. The semiconductor device of claim 10, wherein a lateral distance between the outer sidewall of the second protective layer and the first protective layer is greater than a lateral distance between the inner sidewall of the second protective layer and the first bump.

13. The semiconductor device of claim 1, wherein the second protective layer comprises a first portion covering and conformal with the pad and a second portion outside the first portion, wherein the first protective layer is disposed on the second portion of the second protective layer and outside a vertical projection of the first portion of the second protective layer, and wherein a height of the first pillar is substantially equal to a height of the second pillar, wherein a cross-section surface area of the first reflowable material is greater than a cross-section surface area of the second reflowable material from a top view perspective, and wherein a cross-section of the first bump is geometrically distinguishable from a cross-section of the second bump from a top view perspective.

14. A semiconductor device comprising:

a first substrate comprising a first pad disposed on a surface of the first substrate;

a first protective layer disposed over the surface of the first substrate, the first protective layer comprising an opening to expose the first pad a first bump disposed on the first pad;

a second bump disposed on the first protective layer and outside the opening;

a second substrate disposed over the first substrate; and a first conductive via disposed in the second substrate electrically connected to the second pad, and a second conductive via disposed in the second substrate connected to the third pad, wherein a width of a cross-section of the second conductive via is smaller than a width of the cross-section of the first conductive via from a top view perspective, wherein the first bump is configured to electrically connect the first substrate to the second substrate and wherein the second bump is configured to dissipate heat from the first substrate and to the second substrate, and wherein the second substrate comprises a second pad electrically connecting to the first bump and comprises a third pad connected to the second bump, and wherein the third pad is configured to dissipate heat from the second bump.

15. The semiconductor device of claim 14, wherein in a cross-sectional view, a width of the first bump is greater than a width of the second pad, and a width of the second bump is less than a width of the third.

16. The semiconductor device of claim 15, wherein the first bump comprises a first pillar disposed on the first pad and a first reflowable material between the first pillar and the second pad, wherein the second bump comprises a second pillar disposed on the first protective layer outside the opening and comprises a second reflowable material between the second pillar and the third pad, and wherein a thickness of the first reflowable material is greater than a thickness of the second reflowable material.

17. The semiconductor device of claim 14, wherein the second substrate comprises a second pad electrically connecting to the first bump and comprises a third pad electronically connecting to the second bump, and wherein the third pad is configured to dissipate heat from the second bump, and wherein a vertical projection of a width of the first bump is greater than a vertical projection of a width of the second pad, and a vertical projection of a width of the second bump is smaller than a vertical projection of a width of the third pad.

* * * * *